United States Patent
Song et al.

(10) Patent No.: US 9,818,861 B2
(45) Date of Patent: Nov. 14, 2017

(54) SEMICONDUCTOR DEVICE AND METHOD FOR FORMING THE SAME

(71) Applicant: VANGUARD INTERNATIONAL SEMICONDUCTOR CORPORATION, Hsinchu (TW)

(72) Inventors: Chien-Hsien Song, Kaohsiung (TW); Chung-Ren Lao, Taichung (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/695,864

(22) Filed: Apr. 24, 2015

(65) Prior Publication Data

US 2016/0315189 A1    Oct. 27, 2016

(51) Int. Cl.
| | |
|---|---|
| H01L 29/739 | (2006.01) |
| H01L 29/78 | (2006.01) |
| H01L 29/40 | (2006.01) |
| H01L 29/423 | (2006.01) |
| H01L 29/08 | (2006.01) |
| H01L 29/66 | (2006.01) |

(52) U.S. Cl.
CPC ...... *H01L 29/7823* (2013.01); *H01L 29/0882* (2013.01); *H01L 29/404* (2013.01); *H01L 29/42356* (2013.01); *H01L 29/66681* (2013.01); *H01L 29/7835* (2013.01); *H01L 29/7836* (2013.01)

(58) Field of Classification Search
None
See application file for complete search history.

(56) References Cited

U.S. PATENT DOCUMENTS

| | | | | | |
|---|---|---|---|---|---|
| 5,918,137 | A | * | 6/1999 | Ng | H01L 29/402 257/294 |
| 2004/0251499 | A1 | * | 12/2004 | Yamaguchi | H01L 29/404 257/343 |
| 2008/0308862 | A1 | * | 12/2008 | Theeuwen | H01L 29/402 257/328 |
| 2013/0168730 | A1 | * | 7/2013 | Ashida | H01L 29/7394 257/139 |
| 2014/0256108 | A1 | | 9/2014 | Pendharkar et al. | |
| 2015/0255454 | A1 | * | 9/2015 | Jonishi | H01L 27/0635 257/338 |
| 2016/0190311 | A1 | * | 6/2016 | Izumi | H01L 29/0878 257/339 |

FOREIGN PATENT DOCUMENTS

| | | |
|---|---|---|
| TW | 200607092 A | 2/2006 |
| TW | 201225292 A1 | 6/2012 |
| TW | 201351637 A | 12/2013 |
| TW | 201409712 A | 3/2014 |

* cited by examiner

*Primary Examiner* — Ali Naraghi
(74) *Attorney, Agent, or Firm* — Birch, Stewart, Kolasch & Birch, LLP

(57) ABSTRACT

A semiconductor device including a substrate having a drain region therein is provided. A gate-electrode layer is disposed on the drain region. A first field-plate conductor is disposed on the substrate and overlaps the drain region. A gap is located laterally between the first field-plate conductor and the gate-electrode layer. A second field-plate conductor covers the first field-plate conductor and the gap. The second field-plate conductor is separated from the first field-plate conductor. A method for forming the semiconductor device is also provided.

20 Claims, 3 Drawing Sheets

SEMICONDUCTOR DEVICE AND METHOD FOR FORMING THE SAME

BACKGROUND OF THE INVENTION

Field of the Invention

The invention relates to semiconductor technology, and in particular to a semiconductor device with low gate charge capability.

Description of the Related Art

Lateral diffused metal-oxide-semiconductor field-effect transistors (LD-MOSFETs) have high voltage handling capacity. The trends of power saving and high speed performance affect LD-MOSFET structures. Currently, LD-MOSFETs with lower leakage and on-resistance (Ron) have been developed by many semiconductor manufacturers. Breakdown voltage is taken into account when an LD-MOSFET with low on-resistance is developed.

In general, the higher breakdown voltage that LD-MOSFETs sustain, the higher capacitance the LD-MOSFETs have. One of factors affecting the gate capacitance of LD-MOSFETs is the overlapping area between a gate and a drain region. For example, FIG. 1 shows a cross-sectional view of a conventional LD-MOSFET. The conventional LD-MOSFET comprises a substrate 100. A body region 160 and a drain region 170 are located in the substrate 100. An oxide layer 120, a gate dielectric layer 130 and a gate-electrode layer 140 are sequentially disposed on the substrate 100. The total gate-to-drain capacitance of the conventional LD-MOSFET includes a first gate-to-drain capacitance Cgd1 and a second gate-to-drain capacitance Cgd2 that correspond to the overlapping area between the gate-electrode layer 140 and the drain region 170.

However, conventional LD-MOSFETs usually have high total gate-to-drain capacitance (also referred to as parasitic capacitance), such that the switching speed of the power MOSFET is limited. Even if the parasitic capacitance is decreased, the power MOSFET is unable to work well in high-frequency applications.

Thus, there exists a need in the art for development of a semiconductor device and methods for forming the same capable of mitigating or eliminating the aforementioned problems. Therefore, embodiments of the invention provide a power MOSFET with lower total gate charge (Qg) and lower gate-to-drain capacitance, and able to work well in high-frequency applications.

BRIEF SUMMARY OF THE INVENTION

An embodiment of the invention provides a semiconductor device. The semiconductor device comprises a substrate having a drain region therein. A gate-electrode layer is disposed on the drain region. A first field-plate conductor is disposed on the substrate and overlaps the drain region. A gap is located laterally between the first field-plate conductor and the gate-electrode layer. A second field-plate conductor covers the first field-plate conductor and the gap. The second field-plate conductor is separated from the first field-plate conductor.

An embodiment of the invention provides a method for forming a semiconductor device. The method comprises providing a substrate having a drain region therein. A gate-electrode layer is formed on the drain region. A first field-plate conductor is formed on the substrate, wherein the first field-plate conductor overlaps the drain region. A gap is located laterally between the first field-plate conductor and the gate-electrode layer. A second field-plate conductor covers the first field-plate conductor and the gap, wherein the second field-plate conductor is separated from the first field-plate conductor.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
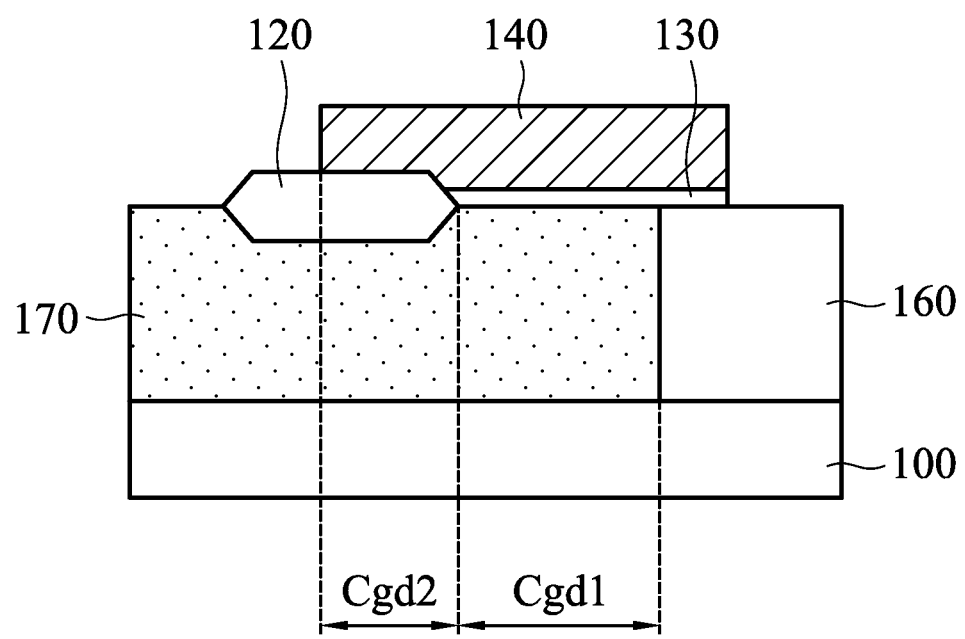
FIG. 1 is a cross-sectional view of a conventional metal-oxide-semiconductor field-effect transistor.

The following description is of a mode for carrying out the invention. This description is made for the purpose of illustrating the general principles of the invention and should not be taken in a limiting sense. The scope of the invention is best determined by reference to the appended claims. Moreover, the same or similar elements in the drawings and the description are labeled with the same reference numbers.

Figure 2:
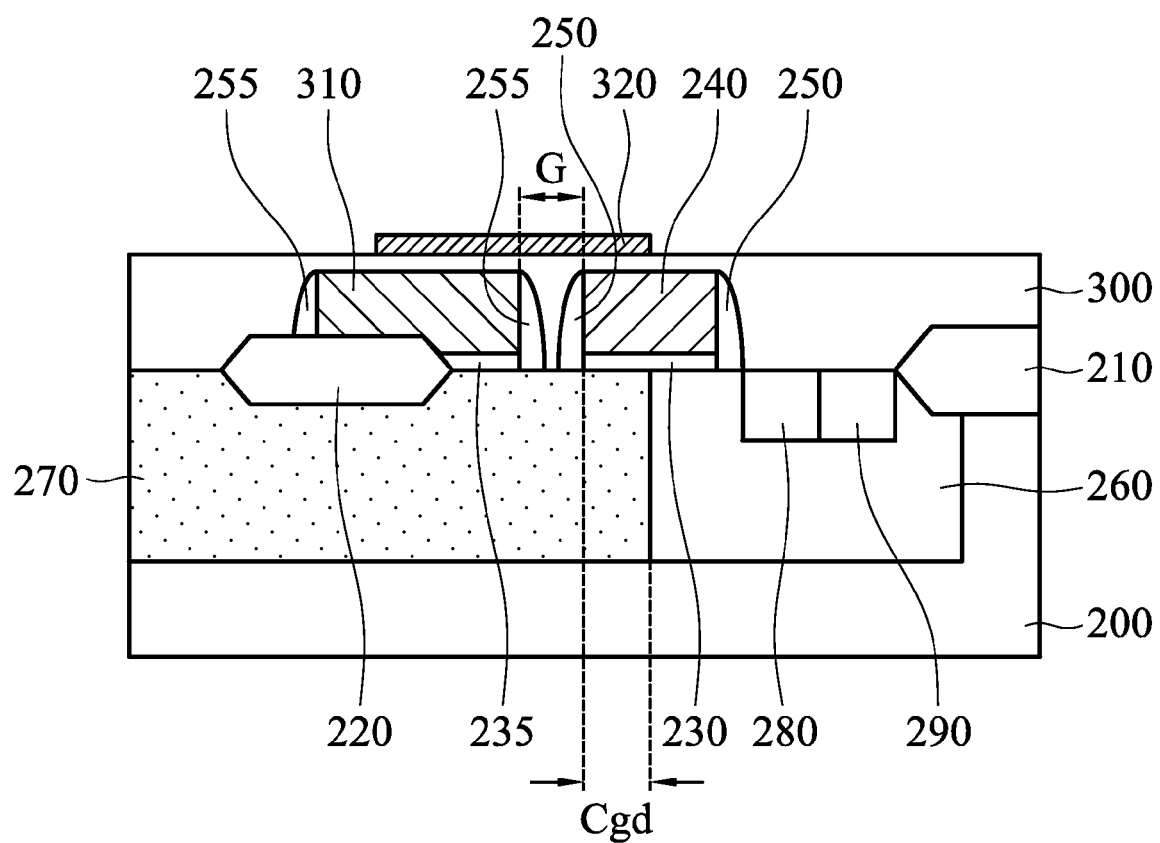
FIG. 2 is a cross-sectional view of an exemplary embodiment of a semiconductor device according to the invention.

An exemplary embodiment of a semiconductor device according to the invention is illustrated with FIG. 2, wherein FIG. 2 is a cross-sectional view of an exemplary embodiment of a semiconductor device according to the invention. The semiconductor device comprises a substrate 200. In the embodiment, the substrate 200 may be a single crystal silicon substrate, an epitaxial crystal silicon substrate, a silicon germanium substrate, a silicon-on-insulator (SOI) substrate, a compound semiconductor substrate or another suitable semiconductor substrate. In the embodiment, the conductivity type of the substrate 200 is n-type, but it is not limited thereto. In other embodiments, the conductivity type of the substrate 200 is p-type and may be determined according to design requirements.

A plurality of isolation structures 210 is located in the substrate 200 to define active regions of the substrate 200. In the embodiment, the isolation structure 210 is local oxidation of silicon (LOCOS). In other embodiments, the isolation structure 210 may be shallow trench isolation (STI).

A body region 260 is located in the substrate 200 of the active region. A source region 280 and a bulk region 290 adjoining the source region 280 are located in the body region 260.

A drain region 270 is located in the substrate 200 of the active region and adjoins the body region 260. The source region 280 is disposed between the bulk region 290 and the drain region 270, and a portion of the body region 260 is sandwiched between the source region 280 and the drain region 270.

A field-plate insulation 220 is disposed on the substrate 200 of the active region and adjoins the drain region 270 so as to control and optimize the shape of electric field distribution. In one embodiment, the field-plate insulation 220 and the isolation structure 210 further extend into the substrate 200, and the depth of the field-plate insulation 220 in the substrate 200 is less than that of the isolation structure 210 in the substrate 200. Moreover, the field-plate insulation 220 has a thickness that is less than that of the isolation structure 210. In the embodiment, the field-plate insulation 220 is LOCOS.

A gate-electrode layer 240 is disposed on the substrate 200 of the active region and a gate dielectric layer 230 is sandwiched between the gate-electrode layer 240 and the drain region 270 in the substrate 200. A portion of the gate-electrode layer 240 vertically overlaps the drain region 270 and the remaining portion of the gate-electrode layer 240 vertically overlaps the body region 260. In the embodiment, the gate-electrode layer 240 may comprise polysilicon, metal or another suitable electrically conductive material. In the embodiment, the gate dielectric layer 230 may comprise oxide, nitride, nitrogen oxide, combinations thereof or another suitable dielectric material.

A plurality of spacers 250 is disposed on two opposite sidewalls of the gate-electrode layer 240. In the embodiment, the spacers 250 may comprise oxide or another suitable dielectric material.

A first field-plate conductor 310 is disposed on the substrate 200 of the active region. A dielectric layer 235 is sandwiched between a portion of the first field-plate conductor 310 and the drain region 270 in the substrate 200 while the field-plate insulation 220 is sandwiched between the remaining portion of the first field-plate conductor 310 and the substrate 200. Namely, the first field-plate conductor 310 adjoins the field-plate insulation 220. In the embodiment, the first field-plate conductor 310 may comprise polysilicon, metal or another suitable electrically conductive material. In one embodiment, the first field-plate conductor 310 and the gate-electrode layer 240 are formed of the same material. In other embodiments, the first field-plate conductor 310 and the gate-electrode layer 240 may be formed of different materials. In one embodiment, the first field-plate conductor 310 and the gate-electrode layer 240 have the same thickness. In other embodiments, the first field-plate conductor 310 and the gate-electrode layer 240 may have different thicknesses. It should be understood that the actual material and thickness (or size) of the first field-plate conductor 310 and the gate-electrode layer 240 are not limited and depend on design requirements.

In the embodiment, the dielectric layer 235 may comprise oxide or another suitable dielectric material. In one embodiment, the dielectric layer 235 and the gate dielectric layer 230 are formed of the same material. In other embodiments, the dielectric layer 235 and the gate dielectric layer 230 may be formed of different materials. In the embodiment, the field-plate insulation 220 has a thickness greater than that of the dielectric layer 235 and the gate dielectric layer 230.

Since the first field-plate conductor 310 is spaced apart from the gate-electrode layer 240, a gap G is located laterally between the first field-plate conductor 310 and the gate-electrode layer 240 and is also located laterally between the field-plate insulation 220 and the gate-electrode layer 240. In the embodiment, the gap G fully overlaps the drain region 270 and the overlying first field-plate conductor 310 fully overlaps the underlying drain region 270. In the embodiment, the first field-plate conductor 310 and the gate-electrode layer 240 are physically and electrically isolated from each other. Namely, the first field-plate conductor 310 and the gate-electrode layer 240 have individual and separated potentials.

A plurality of spacers 255 is disposed on two opposite sidewalls of the first field-plate conductor 310. In other words, the spacer 250 and the spacer 255, which are located between the first field-plate conductor 310 and the gate-electrode layer 240, are filled in the gap G. In the embodiment, the spacers 255 may comprise oxide or another suitable dielectric material. In one embodiment, the spacers 255 and the spacers 250 are formed of the same material. In other embodiments, the spacers 255 and the spacers 250 may be formed of different materials. In one embodiment, the spacer 250 and the spacer 255, which are located between the first field-plate conductor 310 and the gate-electrode layer 240, may be omitted.

A first filling layer 300 is disposed on the substrate 200 and has a flat surface. The first filling layer 300 fills the gap G and fully covers the first field-plate conductor 310, the gate-electrode layer 240, the isolation structure 210, and the field-plate insulation 220. In the embodiment, the first filling layer 300 may comprise oxide or another suitable dielectric material.

A second field-plate conductor 320 is disposed on the flat surface of the first filling layer 300 and fully overlaps the drain region 270. The first filling layer 300 is sandwiched between the first field-plate conductor 310 and the second field-plate conductor 320, such that the second field-plate conductor 320 is isolated from the first field-plate conductor 310. In the embodiment, the second field-plate conductor 320 covers the first field-plate conductor 310, the gap G and the gate-electrode layer 240. The second field-plate conductor 320 does not connect to the first field-plate conductor 310 and they are separated conductors. A portion of the second field-plate conductor 320 vertically overlaps the first field-plate conductor 310. Another portion of the second field-plate conductor 320 vertically overlaps the gate-electrode layer 240 corresponding to the drain region 270. The remaining portion of the second field-plate conductor 320 vertically overlaps the gap G between the first field-plate conductor 310 and the gate-electrode layer 240. In other words, the gap G is covered by the second field-plate conductor 320. In the embodiment, the second field-plate conductor 320 may comprise metal, polysilicon or another suitable electrically conductive material. In one embodiment, the second field-plate conductor 320 and the first field-plate conductor 310 are formed of the same material. In other embodiments, the second field-plate conductor 320 and the first field-plate conductor 310 may be formed of different materials. In the embodiment, the second field-plate conductor 320 has a thickness that is less than that of the first field-plate conductor 310. In some embodiments, the first field-plate conductor 310 and the second field-plate conductor 320 stacked thereon may be grounded, be electrically connected to the source region 280, or have an individual potential to act as a capacitor.

In one embodiment, the first field-plate conductor 310 is partially covered by the second field-plate conductor 320, as shown in FIG. 2. In another embodiment, the second field-plate conductor 320 may laterally extend to align to the sidewall of the first field-plate conductor 310, which is not adjacent to the gap G. In yet another embodiment, the second field-plate conductor 320 may cover both the first field-plate conductor 310 and the field-plate insulation 220. In other embodiments, the second field-plate conductor 320 may further laterally extend outside of the field-plate insulation 220. Moreover, in one embodiment, the gate-electrode layer 240 is partially covered by the second field-plate conductor 320, and the second field-plate conductor 320 does not cover the body region 260, as shown in FIG. 2. In another embodiment, the second field-plate conductor 320 may laterally extend to align to an interface between the body region 260 and the drain region 270. In other embodiments, the second field-plate conductor 320 may laterally extend to cover the body region 260. In the embodiment, the area of the gate-electrode layer 240 covered by the second field-plate conductor 320 is less than that of the first field-plate conductor covered 310 by the second field-plate conductor 320. Moreover, the overlapping area between the gate-electrode layer 240 and the drain region 270 is less than that between the first field-plate conductor 310 and the drain region 270 and is also less than that between the second field-plate conductor 320 and the drain region 270. In this regard, it should be understood that the actual position and size of the second field-plate conductor 320 are not limited and depend on design requirements.

The semiconductor device according to the invention further comprises an interconnection structure disposed on the second field-plate conductor 320 and the first filling layer 300. For example, the interconnection structure may comprise an interlayer dielectric (ILD) layer, inter-metal dielectric (IMD) layers, metal layers, contacts and vias. To simplify the diagram, the interconnection structure is not shown herein. In the embodiment, the second field-plate conductor 320 is disposed under the interconnection structure and is spaced apart from the metal layers of the interconnection structure. The second field-plate conductor 320 may be electrically connected to the first field-plate conductor 310 by the contacts and metal layers of the interconnection structure, but the second field-plate conductor 320 is electrically isolated from the gate-electrode layer 240. Namely, the second field-plate conductor 320 and the first field-plate conductor 310 have the same potential while the second field-plate conductor 320 and the gate-electrode layer 240 have individual and separated potentials. The first field-plate conductor 310 and the second field-plate conductor 320 are able to control and optimize the quantity of electric field distribution.

In other embodiments, the second field-plate conductor 320 may be disposed in the interconnection structure and be a portion of the interconnection structure. For example, the second field-plate conductor 320 may be formed of a bottommost metal layer (M1) of the interconnection structure. In this case, the first filling layer 300 may be omitted, the gap G is filled by the ILD, and the second field-plate conductor 320 is directly disposed on the ILD.

When the second field-plate conductor 320 is not a portion of the interconnection structure, since the thickness of the first filling layer 300 shown in FIG. 2 is much less than that of the ILD, the distance between the second field-plate conductor 320 and the upper surface of the substrate 200 is shorter. Therefore, the second field-plate conductor 320 is able to provide electric field distribution with more obvious control and modulation.

Figure 3:
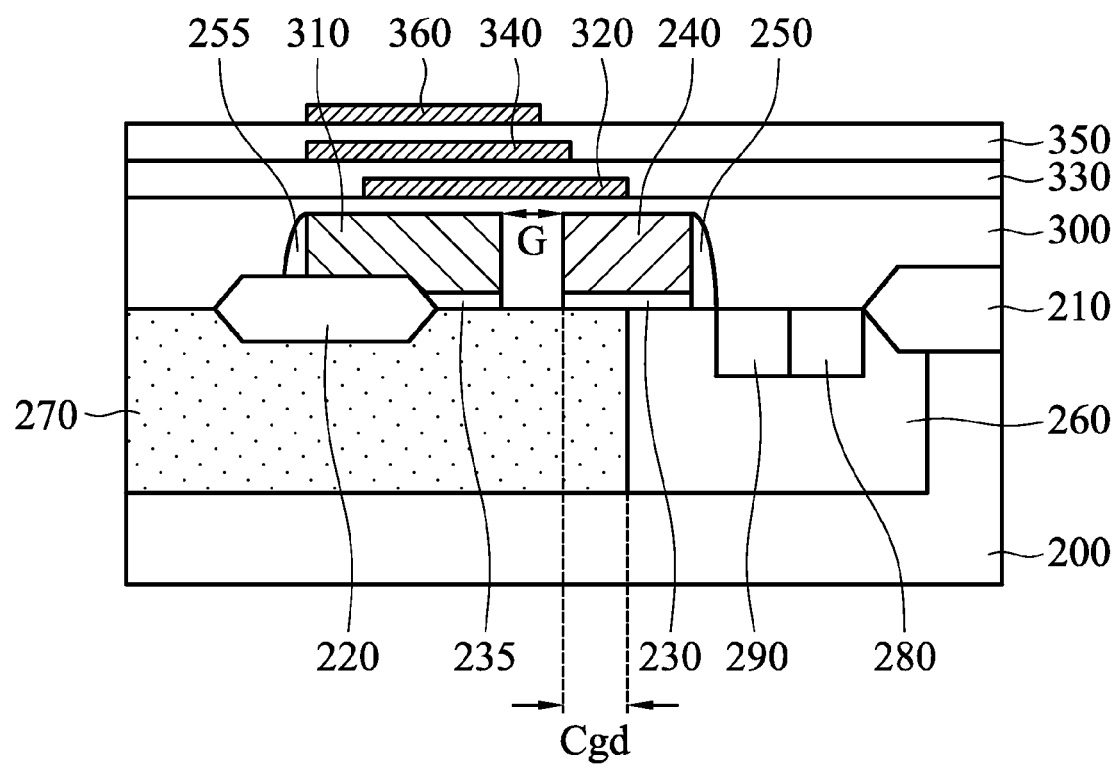
FIG. 3 a cross-sectional view of another exemplary embodiment of a semiconductor device according to the invention.

A cross-sectional view of another exemplary embodiment of a semiconductor device according to the invention is illustrated in FIG. 3, wherein elements in FIG. 3 that are the same as those in FIG. 2 are labeled with the same reference numbers as in FIG. 2 and are not described again for brevity. The semiconductor device structure shown in FIG. 3 is similar to that shown in FIG. 2. One of the differences therebetween is that the semiconductor device structure shown in FIG. 3 further comprises second and third filling layers 330 and 350 and third and fourth field-plate conductors 340 and 360. The second filling layer 330 is disposed on the first filling layer 300 and covers the second field-plate conductor 320. The third field-plate conductor 340 is disposed on the flat surface of the second filling layer 330 and fully overlaps the drain region 270. In the embodiment, the third field-plate conductor 340 covers the first field-plate conductor 310, the gap G and the second field-plate conductor 320, and the second filling layer 330 is sandwiched between the second field-plate conductor 320 and the third field-plate conductor 340. The third filling layer 350 is disposed on the second filling layer 330 and covers the third field-plate conductor 340. The fourth field-plate conductor 360 is disposed on the flat surface of the third filling layer 350 and fully overlaps the drain region 270. In the embodiment, the second and third filling layers 330 and 350 may comprise oxide or another suitable dielectric material, and the third and fourth field-plate conductors 340 and 360 may comprise metal, polysilicon or another suitable electrically conductive material.

As shown in FIG. 3, the third field-plate conductor 340 laterally extends to align to the sidewall of the first field-plate conductor 310, which is not adjacent to the gap G. The third field-plate conductor 340 further laterally extends to align to the sidewall of the gate-electrode layer 240, which is adjacent to the gap G. As a result, the third field-plate conductor 340 covers the gap G. The fourth field-plate conductor 360 laterally extends to align to the sidewall of the first field-plate conductor 310, which is not adjacent to the gap G, without extending to align to the sidewall of the gate-electrode layer 240, which is adjacent to the gap G. As a result, the fourth field-plate conductor 360 partially covers the gap G. Both the third and fourth field-plate conductors 340 and 360 vertically overlap the first field-plate conductor 310 without overlapping the gate-electrode layer 240. In other embodiments, the third field-plate conductor 340 and/or the fourth field-plate conductor 360 may optionally extend to vertically overlap the gate-electrode layer 240.

The differences between FIGS. 2 and 3 further comprise that the second field-plate conductor 320 shown in FIG. 3 laterally extends to align to the interface between the body region 260 and the drain region 270. Moreover, the gap G shown in FIG. 3 is fully filled with the first filling layer 300 without being partially filled with the spacer 250 and the spacer 255.

In one embodiment, the second, third and fourth field-plate conductors 320, 340 and 360 have different sizes. In another embodiment, any two of the second, third and fourth field-plate conductors 320, 340 and 360 may have the same size. In other embodiments, the second, third and fourth field-plate conductors 320, 340 and 360 may have the same size. It should be understood that the actual size (or thickness) and position of the second, third and fourth field-plate conductors 320, 340 and 360 are not limited and depend on design requirements.

Similar to the embodiment of FIG. 2, in the embodiment of FIG. 3, the semiconductor device further comprises an interconnection structure disposed on the fourth field-plate conductor 360 and the third filling layer 350. To simplify the diagram, the interconnection structure is not shown herein. The fourth field-plate conductor 360 is disposed under the interconnection structure and is spaced apart from the metal layers of the interconnection structure. The second, third and fourth field-plate conductors 320, 340 and 360 may be electrically connected to the first field-plate conductor 310 by the contacts and metal layers of the interconnection structure, but all the field-plate conductors 310, 320, 340 and 360 are electrically isolated from the gate-electrode layer 240. Namely, the gate-electrode layer 240 has an individual potential. All the field-plate conductors 310, 320, 340 and 360 are able to control and modulate the electric field distribution. The shorter the distance between the field-plate conductor and the upper surface of the substrate 200, the greater the control of electric field distribution provided by the field-plate conductor.

In another embodiment, the fourth field-plate conductor 360 may be disposed in the interconnection structure and be a portion of the interconnection structure. For example, the fourth field-plate conductor 360 may be formed of a bottommost metal layer of the interconnection structure. In yet another embodiment, the third and fourth field-plate conductors 340 and 360 may be disposed in the interconnection structure and be portions of the interconnection structure. For example, the third field-plate conductor 340 may be formed of a bottommost metal layer of the interconnection structure and the fourth field-plate conductor 360 may be formed of a second metal layer (M2) on the bottommost metal layer. In other embodiments, the second, third and fourth field-plate conductors 320, 340 and 360 may be disposed in the interconnection structure and be portions of the interconnection structure. For example, the second field-plate conductor 320 may be formed of a bottommost metal layer of the interconnection structure, the third field-plate conductor 340 may be formed of a second metal layer on the bottommost metal layer, and the fourth field-plate conductor 360 may be formed of a third metal layer (M3) on the second metal layer.

As shown in FIG. 2, the semiconductor device comprises the second field-plate conductor 320 stacked on the first field-plate conductor 310. As shown in FIG. 3, the semiconductor device comprises the second, third and fourth field-plate conductors 320, 340 and 360 stacked on the first field-plate conductor 310. However, in other embodiments, the semiconductor device may comprise two or more than three field-plate conductors stacked on the first field-plate conductor 310. It should be understood that the actual number of field-plate conductors stacked on the first field-plate conductor 310 depends on design requirements.

According to the aforementioned embodiments, the semiconductor device comprises the first field-plate conductor 310 that is physically separated from the gate-electrode layer 240 by the gap G and is electrically isolated from the gate-electrode layer 240. As a result, the gate of the semiconductor device is formed of the gate-electrode layer 240 without the conductor 310, such that the overlapping area between the gate and the drain region is substantially decreased. Therefore, the gate capacitance of the semiconductor device is significantly reduced.

For example, the total gate-to-drain capacitance Cgd (as shown in FIGS. 2 and 3) of the semiconductor device according to the aforementioned embodiments is much smaller than that of the conventional LD-MOSFET shown in FIG. 1 (the total gate-to-drain capacitance of the conventional LD-MOSFET includes the first gate-to-drain capacitance Cgd1 and the second gate-to-drain capacitance Cgd2). Apparently, the total gate-to-drain capacitance of the semiconductor devices shown in FIGS. 2 and 3 do not include the second gate-to-drain capacitance Cgd2 shown in FIG. 1. Furthermore, the total gate-to-drain capacitance Cgd shown in FIGS. 2 and 3 is even less than the first gate-to-drain capacitance Cgd1 shown in FIG. 1.

When the total gate-to-drain capacitance Cgd of the semiconductor device according to the aforementioned embodiments is significantly decreased by eliminating the second gate-to-drain capacitance Cgd2 and reducing the first gate-to-drain capacitance Cgd1 as low as possible, the electric field distribution of the semiconductor device would be discontinuously reduced. For example, the electric field corresponding to the gap G, which is located laterally between the first field-plate conductor 310 and the gate-electrode layer 240, is abruptly increased and the electric field is concentrated at the position corresponding to the gap G. As a result, the semiconductor device would not successfully work.

According to the aforementioned embodiments, the semiconductor device further comprises at least one field-plate conductor stacked on the first field-plate conductor 310 and at least cover the gap G. The field-plate conductor(s) stacked on the first field-plate conductor 310 and the gate-electrode layer 240 have individual and separated potentials. As a result, the electric field corresponding to the gap G is distributed and the electric field distribution of the semiconductor device can be continuously and gradually reduced. Therefore, the switching speed of the semiconductor device according to the aforementioned embodiments can be improved and the semiconductor device is able to work well in high-frequency applications.

One exemplary embodiment of a method for forming a semiconductor device according to the invention is described herein with reference to FIG. 2. A substrate 200 comprising active regions is provided. The active regions are defined by isolation structures 210 formed in the substrate 200. To simplify the diagram, only a portion of single active region is shown in FIG. 2. A field-plate insulation 220 is then grown on the substrate 200 of the active region, such as by LOCOS technology. A gate dielectric layer 230 and a dielectric layer 235 are formed on the substrate 200 by suitable deposition and patterning processes. For example, the deposition process may be a chemical vapor deposition (CVD), physical vapor deposition (PVD), or coating process, and the patterning process contains a lithography process and an etching process (such as a dry etching process, a wet etching process, a plasma etching process, or a reactive ion etching process). In one embodiment, the gate dielectric layer 230 and the dielectric layer 235 are formed in the same step. However, in other embodiments, the gate dielectric layer 230 and the dielectric layer 235 may be formed in different steps and/or be formed of different materials.

Next, a gate-electrode layer 240 and a first field-plate conductor 310 are formed on the substrate 200 of the active region by suitable deposition and patterning processes. In one embodiment, the gate-electrode layer 240 and the first field-plate conductor 310 are formed in the same step. However, in other embodiments, the gate-electrode layer 240 and the first field-plate conductor 310 may be formed in different steps and/or be formed of different materials. The same material layer may be directly separated into the first field-plate conductor 310 and the gate-electrode layer 240, and a gap G is formed between the first field-plate conductor 310 and the gate-electrode layer 240 by the above-mentioned patterning process without performing additional processes.

Next, a body region 260 and a drain region 270 adjoining the body region 260 are formed in the substrate 200 of the active region by suitable ion-implantation processes. A source region 280 and a bulk region 290 adjoining the source region 280 are then formed in the body region 260 by suitable ion-implantation processes.

A plurality of spacers 250 is formed on two opposite sidewalls of the gate-electrode layer 240 and a plurality of spacers 255 is formed on two opposite sidewalls of the first field-plate conductor 310 by suitable deposition and patterning processes. In one embodiment, the spacers 250 and the spacers 255 are formed in the same step. However, in other embodiments, the spacers 250 and the spacers 255 may be formed in different steps and/or be formed of different materials.

Afterward, a first filling layer 300 is formed on the substrate 200 by a suitable deposition process to cover the first field-plate conductor 310, the gate-electrode layer 240, the isolation structure 210, and the field-plate insulation 220 and provide a flat surface. A second field-plate conductor 320 is then formed on the flat surface of the first filling layer 300 by suitable deposition and patterning processes. In some embodiments, the method for forming a semiconductor device according to the invention may further comprise performing other suitable steps not mentioned herein so as to complete the so-called front-end manufacturing process of a semiconductor device. Next, an interconnection structure (not shown) is formed on the second field-plate conductor 320 and the first filling layer 300 by the so-called back-end manufacturing process of a semiconductor device.

In summary, the method for forming a semiconductor device shown in FIG. 2 at least comprises step (i) forming the field-plate insulation 220, the gate dielectric layer 230 and the dielectric layer 235 on the substrate 200 comprising isolation structures 210 therein; step (ii) forming the gate-electrode layer 240 and the first field-plate conductor 310 on the field-plate insulation 220, the gate dielectric layer 230 and the dielectric layer 235; step (iii) forming the body region 260 and the drain region 270; step (iv) forming the source region 280 and the bulk region 290 and forming the spacers 250 and 255; step (v) forming the first filling layer 300 and the second field-plate conductor 320; and step (vi) forming the interconnection structure.

However, in some embodiments, step (v) is not limited to being performed between step (iv) and step (vi). Step (v) may optionally be performed between step (ii) and step (iii) or between step (iii) and step (iv). In other embodiments, when the second field-plate conductor 320 is a portion of the interconnection structure, step (v) is omitted and the second field-plate conductor 320 is formed in step (vi). It should be understood that the actual step of forming the second field-plate conductor 320 is not limited and depends on design requirements.

Another exemplary embodiment of a method for forming a semiconductor device according to the invention is described herein with reference to FIG. 3, wherein elements in FIG. 3 that are the same as those in FIG. 2 are labeled with the same reference numbers as in FIG. 2 and are not described again for brevity. The method for forming the semiconductor shown in FIG. 3 is similar to that for forming the semiconductor shown in FIG. 2. The difference therebetween is that step (v) of the method for forming the semiconductor shown in FIG. 3 further comprises sequentially forming the second filling layer 330, the third field-plate conductor 340, the third filling layer 350, and the fourth field-plate conductor 360 by multiple deposition and patterning processes after forming the first filling layer 300 and the second field-plate conductor 320. Similarly, in some embodiments, step (v) is not limited to being performed between step (iv) and step (vi), and step (v) may optionally be performed between step (ii) and step (iii) or between step (iii) and step (iv).

In one embodiment, when the fourth field-plate conductor 360 is a portion of the interconnection structure, the second and third field-plate conductors 320 and 340 are formed in step (v) while the fourth field-plate conductor 360 is formed in step (vi). In another embodiment, when the third and fourth field-plate conductors 340 and 360 are portions of the interconnection structure, the second field-plate conductor 320 is formed in step (v) while the third and fourth field-plate conductors 340 and 360 are formed in step (vi). In other embodiments, when the second, third and fourth field-plate conductors 320, 340 and 360 are portions of the interconnection structure, step (v) is omitted and all the second, third and fourth field-plate conductors 320, 340 and 360 are formed in step (vi).

According to the aforementioned embodiments, the gate-electrode layer 240 and the first field-plate conductor 310 can be formed simultaneously and be separated from each other by the formed gap G through the same deposition process and the same patterning process without additional steps. Moreover, the first filling layer 310 provides the second field-plate conductor 320 with a flat surface so as to facilitate successfully forming the second field-plate conductor 320.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate having a drain region therein;
   a gate-electrode layer disposed on the drain region;
   a first field-plate conductor disposed on the substrate and entirely located on the drain region, wherein a bottom surface of the first field-plate conductor and a bottom surface of the gate-electrode layer are at a same level, and a gap is located laterally between the first field-plate conductor and the gate-electrode layer;
   a field-plate insulation sandwiched between the first field-plate conductor and the drain region, wherein a portion of the field-plate insulation is extended into the substrate; and
   a second field-plate conductor covering the first field-plate conductor and the gap, wherein the second field-plate conductor is separated from the first field-plate conductor.

2. The semiconductor device as claimed in claim 1, wherein the second field-plate conductor further covers the gate-electrode layer.

3. The semiconductor device as claimed in claim 2, wherein an area of the gate-electrode layer covered by the second field-plate conductor is less than that of the first field-plate conductor covered by the second field-plate conductor.

4. The semiconductor device as claimed in claim 1, wherein the gate-electrode layer overlaps the drain region, and an overlapping area between the gate-electrode layer and the drain region is less than that between the first field-plate conductor and the drain region.

5. The semiconductor device as claimed in claim 1, wherein the gate-electrode layer overlaps the drain region, and an overlapping area between the gate-electrode layer and the drain region is less than that between the second field-plate conductor and the drain region.

6. The semiconductor device as claimed in claim 1, wherein the second field-plate conductor further covers the field-plate insulation.

7. The semiconductor device as claimed in claim 6, wherein the gap is located laterally between the field-plate insulation and the gate-electrode layer.

8. The semiconductor device as claimed in claim 1, further comprising a first filling layer sandwiched between the first field-plate conductor and the second field-plate conductor, such that the second field-plate conductor is separated from the first field-plate conductor, wherein the first filling layer has a flat surface.

9. The semiconductor device as claimed in claim 1, further comprising a third field-plate conductor covering the first field-plate conductor, the gap and the second field-plate conductor.

10. The semiconductor device as claimed in claim 9, further comprising a second filling layer sandwiched between the second field-plate conductor and the third field-plate conductor, wherein the second filling layer has a flat surface.

11. A method for forming a semiconductor device, comprising:
providing a substrate having a drain region therein;
forming a gate-electrode layer on the drain region;
forming a first field-plate conductor on the substrate, wherein the first field-plate conductor is entirely located on the drain region, and wherein a bottom surface of the first field-plate conductor and a bottom surface of the gate-electrode layer are at a same level, and a gap is located laterally between the first field-plate conductor and the gate-electrode layer;
forming a field-plate insulation sandwiched between the first field-plate conductor and the drain region, wherein a portion of the field-plate insulation is extended into the substrate; and
forming a second field-plate conductor covering the first field-plate conductor and the gap, wherein the second field-plate conductor is separated from the first field-plate conductor.

12. The method as claimed in claim 11, wherein the second field-plate conductor further covers the gate-electrode layer.

13. The method as claimed in claim 12, wherein an area of the gate-electrode layer covered by the second field-plate conductor is less than that of the first field-plate conductor covered by the second field-plate conductor.

14. The method as claimed in claim 11, wherein the gate-electrode layer overlaps the drain region, and an overlapping area between the gate-electrode layer and the drain region is less than that between the first field-plate conductor and the drain region.

15. The method as claimed in claim 11, wherein the gate-electrode layer overlaps the drain region, and an overlapping area between the gate-electrode layer and the drain region is less than that between the second field-plate conductor and the drain region.

16. The method as claimed in claim 11, wherein the second field-plate conductor further covers the field-plate insulation.

17. The method as claimed in claim 16, wherein the gap is located laterally between the field-plate insulation and the gate-electrode layer.

18. The method as claimed in claim 11, further comprising forming a first filling layer sandwiched between the first field-plate conductor and the second field-plate conductor, such that the second field-plate conductor is separated from the first field-plate conductor, wherein the first filling layer has a flat surface.

19. The method as claimed in claim 11, further comprising forming a third field-plate conductor covering the first field-plate conductor, the gap and the second field-plate conductor.

20. The method as claimed in claim 19, further comprising forming a second filling layer sandwiched between the second field-plate conductor and the third field-plate conductor, wherein the second filling layer has a flat surface.

* * * * *